United States Patent
Yasuda et al.

(10) Patent No.: US 9,646,868 B2
(45) Date of Patent: May 9, 2017

(54) WAFER TEMPORARY BONDING METHOD AND THIN WAFER MANUFACTURING METHOD

(71) Applicant: Shin-Etsu Chemical Co., Ltd., Tokyo (JP)

(72) Inventors: Hiroyuki Yasuda, Annaka (JP); Michihiro Sugo, Annaka (JP); Shohei Tagami, Annaka (JP); Masahito Tanabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/979,102

(22) Filed: Dec. 22, 2015

(65) Prior Publication Data
US 2016/0189998 A1      Jun. 30, 2016

(30) Foreign Application Priority Data
Dec. 24, 2014   (JP) ................... 2014-259813

(51) Int. Cl.
| | |
|---|---|
| H01L 21/683 | (2006.01) |
| C09J 7/02 | (2006.01) |
| C09J 183/04 | (2006.01) |
| B32B 7/06 | (2006.01) |
| B32B 7/12 | (2006.01) |
| B24B 37/30 | (2012.01) |
| H01L 21/304 | (2006.01) |
| H01L 21/306 | (2006.01) |

(52) U.S. Cl.
CPC .......... *H01L 21/6836* (2013.01); *B24B 37/30* (2013.01); *B32B 7/06* (2013.01); *B32B 7/12* (2013.01); *C09J 7/0296* (2013.01); *C09J 183/04* (2013.01); *H01L 21/304* (2013.01); *H01L 21/30625* (2013.01); *H01L 21/6835* (2013.01); *H01L 2221/6834* (2013.01); *H01L 2221/68327* (2013.01); *H01L 2221/68381* (2013.01)

(58) Field of Classification Search
None
See application file for complete search history.

(56) References Cited

U.S. PATENT DOCUMENTS

| | | | |
|---|---|---|---|
| 7,541,264 B2 | 6/2009 | Gardner et al. | |
| 2013/0108866 A1* | 5/2013 | Kato ...................... | C08G 77/52 428/354 |
| 2013/0280886 A1* | 10/2013 | Kato ........................ | B32B 7/06 438/459 |

FOREIGN PATENT DOCUMENTS

| | | |
|---|---|---|
| JP | 2004-64040 A | 2/2004 |
| JP | 2006-328104 A | 12/2006 |
| WO | 2004/006296 A2 | 1/2004 |

* cited by examiner

*Primary Examiner* — Jiong-Ping Lu
(74) *Attorney, Agent, or Firm* — Westerman, Hattori, Daniels & Adrian, LLP

(57) ABSTRACT

A method for temporarily bonding a wafer to a support via a temporary bonding arrangement is provided. The arrangement is a composite temporary adhesive layer consisting of a non-silicone thermoplastic resin layer (A) which is releasably bonded to the wafer, a thermosetting siloxane polymer layer (B) laid thereon, and a thermosetting siloxane-modified polymer layer (C) releasably bonded to the support. The method comprises the steps of providing a wafer laminate having a thermosetting silicone composition layer (B') formed on the resin layer (A) which has been formed on the wafer, providing a support laminate having a siloxane-containing composition layer (C') formed on the support, joining and heating layer (B') and layer (C') in vacuum for bonding and curing the layers together.

13 Claims, 1 Drawing Sheet

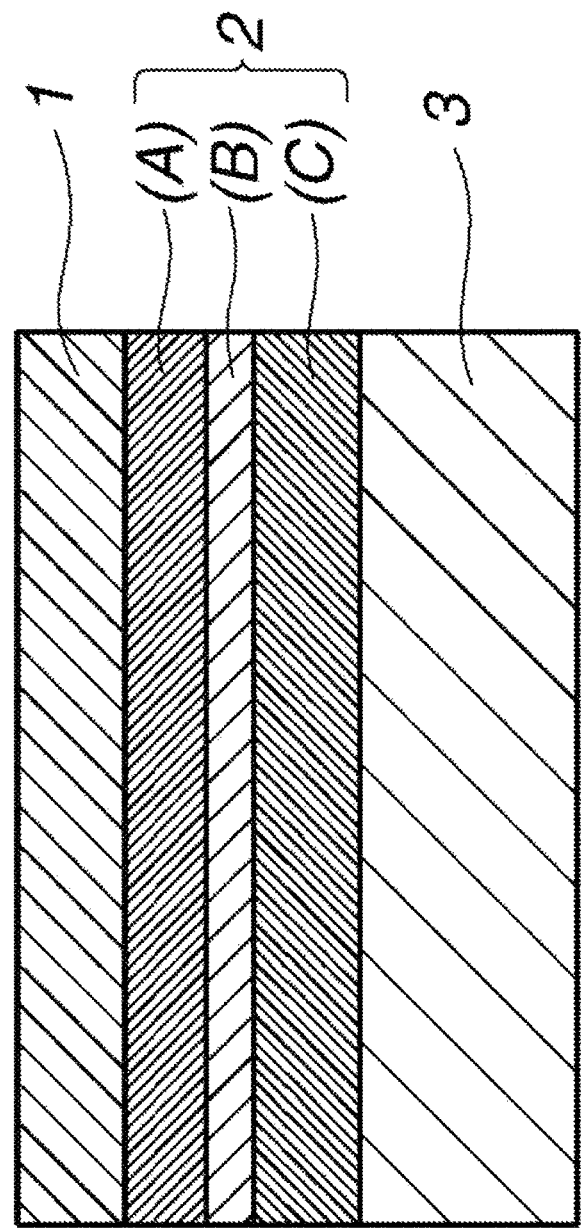

US 9,646,868 B2

WAFER TEMPORARY BONDING METHOD AND THIN WAFER MANUFACTURING METHOD

CROSS-REFERENCE TO RELATED APPLICATION

This non-provisional application claims priority under 35 U.S.C. S119(a) on Patent Application No. 2014-259813 filed in Japan on Dec. 24, 2014, the entire contents of which are hereby incorporated by reference.

TECHNICAL FIELD

This invention relates to a method for temporarily bonding a wafer to a support and a method for manufacturing a thin wafer.

BACKGROUND ART

Three-dimensional semiconductor packages become essential for a higher density and capacity. The 3D semiconductor packaging technology is by thinning semiconductor chips, and stacking them in multilayer structure while providing through-silicon via (TSV) interconnects. Fabrication of such packages requires the steps of thinning a substrate having a semiconductor circuit formed therein by grinding its non-circuit forming surface or back surface, and forming TSV and electrodes on the back surface. In the prior art, prior to the step of grinding the back surface of a silicon substrate, a protective tape is attached to the surface of the substrate opposite to the surface to be ground for preventing the wafer from breakage during the grinding step. Since the protective tape is based on an organic resin film, it is flexible, but has insufficient strength and heat resistance to withstand the TSV forming step and the step of forming interconnects on the back surface.

It is then proposed to bond a semiconductor substrate to a support of silicon or glass, for example, via an adhesive layer. The resulting system is sufficient to withstand the steps of grinding the back surface and forming TSV and electrodes on the back surface. The adhesive layer for bonding the substrate to the support is critical for this system. The adhesive layer must bond the substrate to the support without leaving gaps, be durable enough to withstand the subsequent steps, and eventually allow the thin wafer to be readily released from the support. The adhesive layer is referred herein to as "temporary adhesive layer" or "temporary bond layer" since it is finally removed.

With regard to temporary adhesive layers and removal thereof, Patent Document 1 discloses a layer of an adhesive composition containing a light absorber. The adhesive layer is irradiated with high intensity light for decomposing the adhesive composition so that the layer may be removed from the support. Patent Document 2 discloses a layer of an adhesive composition comprising a heat melting hydrocarbon compound, wherein the layer can be bonded and released in the heat molten condition. The former technology requires an expensive tool such as laser and a longer time of treatment per substrate. The latter technology is simple because of control only by heat, but is applicable to a limited range because of instability at high temperatures in excess of 200° C. These temporary adhesive layers are not adequate to form a layer of uniform thickness on a heavily stepped substrate and to provide a complete bond to the support.

Patent Document 3 discloses the use of a silicone pressure-sensitive adhesive composition as the temporary adhesive layer. A substrate is bonded to a support with an addition reaction curable silicone adhesive composition. On removal, the assembly is immersed in an etching solution capable of dissolving or decomposing the silicone resin, whereby the substrate is separated from the support. This method takes a very long time for removal and is applicable to the commercial manufacture process with difficulty.

CITATION LIST

Patent Document 1: JP-A 2004-064040 (WO 2004006296)
Patent Document 2: JP-A 2006-328104
Patent Document 3: U.S. Pat. No. 7,541,264

SUMMARY OF INVENTION

An object of the invention is to provide a wafer temporary bonding method which facilitates to establish a temporary bond between a wafer and a support, enables to form an adhesive layer of uniform thickness even on a heavily stepped substrate, is compatible with the TSV forming and back surface interconnect forming steps, offers high resistance to wafer heating steps such as CVD, and allows for easy removal. Another object is to provide a method for manufacturing a thin wafer in a highly productive manner.

In one aspect, the invention provides a method for temporarily bonding a wafer having a circuit-forming front surface and a back surface to be processed to a support via a temporary bonding arrangement, the temporary bonding arrangement being a composite temporary adhesive layer of trilayer structure consisting of a first temporary bond layer in the form of a non-silicone thermoplastic resin layer (A) which is releasably bonded to the front surface of the wafer, a second temporary bond layer in the form of a thermosetting siloxane polymer layer (B) laid on the first temporary bond layer, and's third temporary bond layer in the form of a thermosetting siloxane-modified polymer layer (C) releasably bonded to the support. The method comprises the steps of providing a wafer laminate having a thermosetting silicone composition layer (B') for forming the thermosetting siloxane polymer layer (B), formed on the resin layer (A) which has been formed on the front surface of the wafer; providing a support laminate having a siloxane-containing composition layer (C') for forming the thermosetting siloxane-modified polymer layer (C), formed on the support; and joining and heating the thermosetting silicone composition layer (B') and the siloxane-containing composition layer (C') in vacuum for bonding and curing the layers together. Preferably, the step of joining and heating in vacuum for bonding the layers together is at a temperature of 40 to 200° C.

The use of the temporary bonding arrangement thus constructed facilitates to establish a temporary bond between the wafer and the support, enables to form an adhesive layer of uniform thickness even on a heavily stepped substrate, is compatible with the TSV forming and back surface interconnect forming steps, offers high resistance to wafer heating steps such as CVD, and allows for easy removal. These contribute to the increased productivity of thin wafers.

In a preferred embodiment, the thermosetting silicone composition layer (B') is a layer of a composition comprising (B-1) an organopolysiloxane having at least two alkenyl groups per molecule, (B-2) an organohydrogenpolysiloxane containing at least two silicon-bonded hydrogen atoms (Si—H groups) per molecule, in such an amount that a molar ratio of Si—H groups in component (B-2) to alkenyl groups in component (B-1) may range from 0.3/1 to 10/1, and (B-3) a platinum-based catalyst. The thermosetting silicone composition layer (B') thus constructed offers more CVD resistance.

More preferably the composition of the thermosetting silicone composition layer (B') further comprises (B-4) 0.1 to 10 parts by weight of a reaction regulator per 100 parts by weight of components (B-1) and (B-2) combined. The thermosetting silicone composition of layer (B') thus constructed is advantageous in that the composition (or treating liquid) does not thicken or gel prior to heat curing.

In a preferred embodiment, the thermosetting siloxane polymer layer (B) requires a release force of 2 gf to 50 gf to peel it back at an angle of 180° from a polyimide test piece of 25 mm wide. The thermosetting siloxane polymer layer (B) having a peeling release force in the range eliminates the risk that the wafer is moved aside during wafer grinding, while maintaining ease of release.

In a preferred embodiment, the siloxane-containing composition layer (C') is a layer of a composition comprising 100 parts by weight of a siloxane bond-containing polymer comprising recurring units of the general formula (1) and having a weight average molecular weight of 3,000 to 500,000, preferably 10,000 to 100,000, and 0.1 to 50 parts by weight of a crosslinker which is selected from the group consisting of an amino condensate, melamine resin or urea resin which is modified with formaldehyde or formaldehyde-alcohol, a phenol compound having on average at least two methylol or alkoxymethylol groups per molecule, and an epoxy compound having on average at least two epoxy groups per molecule.

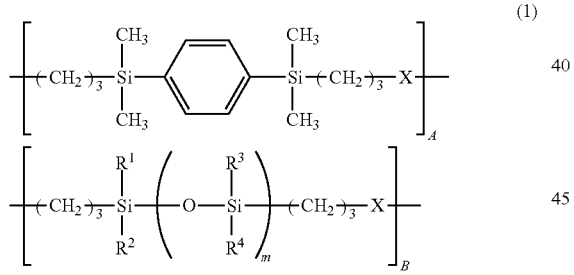
(1)

Herein $R^1$ to $R_4$ are each independently a monovalent hydrocarbon group of 1 to 8 carbon atoms, m is an integer of 1 to 100, B is a positive number, A is 0 or a positive number, and A+B=1. X is a divalent organic group having the general formula (2):

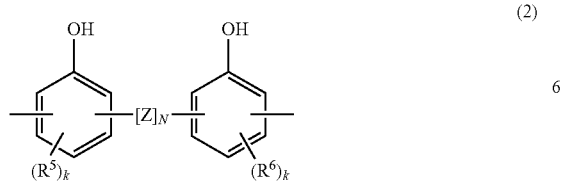
(2)

wherein Z is a divalent organic group selected from the following:

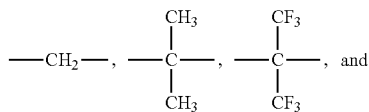

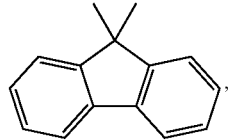

N is 0 or 1, $R^5$ and $R^6$ are each independently an alkyl or alkoxy group of 1 to 4 carbon atoms, and k is 0, 1 or 2. The thermosetting siloxane-modified polymer layer (C) thus constructed has more heat resistance.

In another preferred embodiment, the siloxane-containing composition layer (C') is a layer of a composition comprising 100 parts by weight of a siloxane bond-containing polymer comprising recurring units of the general formula (3) and having a weight average molecular weight of 3,000 to 500,000, and 0.1 to 50 parts by weight of a crosslinker which is selected from the group consisting of a phenol compound having on average at least two phenolic hydroxyl groups per epoxy groups per molecule.

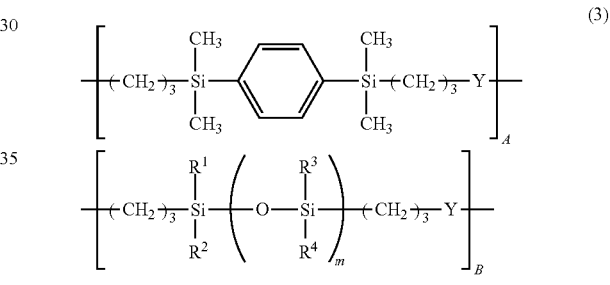
(3)

Herein $R^1$ to $R^4$ are each independently a monovalent hydrocarbon group of 1 to 8 carbon atoms, m is an integer of 1 to 100, B is a positive number, A is 0 or a positive number, A+B=1, and Y is a divalent organic group having the general formula (4):

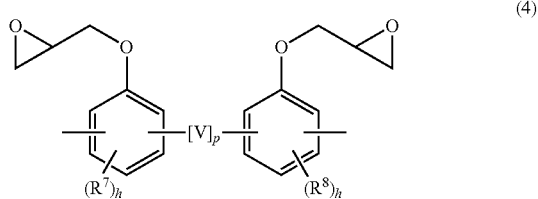
(4)

wherein V is a divalent organic group selected from the following:

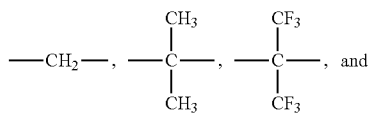

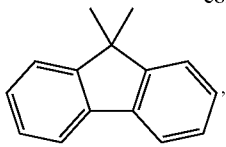

p is 0 or 1, $R^7$ and $R^8$ are each independently an alkyl or alkoxy group of 1 to 4 carbon atoms, and h is 0, 1 or 2. The thermosetting siloxane-modified polymer layer (C) thus constructed has more heat resistance.

In another aspect, the invention provides a method for manufacturing a thin wafer from a starting wafer having a circuit-forming front surface and a non-circuit-forming back surface, comprising the steps of:

(a) forming a first temporary bond layer of a non-silicone thermoplastic resin (A) on the circuit-forming front surface of the wafer, forming a thermosetting silicone composition layer (B') thereon, forming a siloxane-containing composition layer (C') on one surface of a support, and joining the thermosetting silicone composition layer (B') on the wafer to the siloxane-containing composition layer (C') on the support in vacuum, (b) heat curing the thermosetting silicone composition layer (B') and the siloxane-containing composition layer (C') for thereby bonding a second temporary bond layer in the form of a thermosetting siloxane polymer layer (B) which is the cured product of the thermosetting silicone composition layer (B') to a third temporary bond layer in the form of a thermosetting siloxane-modified polymer layer (C) which is the cured product of the siloxane-containing composition layer (C'), thus yielding a composite temporary adhesive layer of trilayer structure consisting of the first, second and third temporary bond layers via which the wafer is bonded to the support, (c) grinding or polishing the non-circuit-forming back surface of the wafer bonded to the support via the composite temporary adhesive layer, (d) processing the non-circuit-forming back surface of the wafer.

(e) releasing the processed wafer from the composite temporary adhesive layer and the support, and (f) cleaning the surface of the processed wafer which has been released from the composite temporary adhesive layer.

In a preferred embodiment, step (e) includes immersing the overall wafer in a solvent and thereafter releasing the support from the wafer; and step (f) includes cleaning with two fluids.

Since the thin wafer manufacturing method uses the composite temporary adhesive layer of trilayer structure to bond the wafer to the support, a thin wafer having a TSV structure or bump connect structure can be readily manufactured. In the thin wafer manufacturing method, the bonding temperature, the composition of thermosetting silicone composition layer (B'), and the composition of siloxane-containing composition layer (C') are the same as in the temporary bonding method.

Advantageous Effects of Invention

The composite temporary adhesive layer of trilayer structure is applicable to a wide range of semiconductor film forming process because even though a thermosetting siloxane-modified resin (polymer layer (C)) is used as a supporting layer for wafer bonding, bonding in vacuum of the siloxane-containing composition layer (C') for layer (C) to the thermosetting silicone composition layer (B') ensures to inhibit voids from forming due to steps or irregularities prevailing on the substrate side, and that the resin is so heat resistant that neither thermal decomposition nor flow of the resin occurs at a temperature of higher than 200° C. A temporary adhesive layer of high thickness uniformity can be formed even on a stepped wafer by forming the resin layer (A) on the wafer, forming the thermosetting silicone composition layer (B') thereon, and bonding in vacuum the wafer having polymer layer (A) and layer (B') formed thereon to the support having siloxane-containing composition layer (C') formed thereon for curing layers (B') and (C'). By virtue of thickness uniformity of the temporary adhesive layer, a uniform thin wafer of up to 50 μm can be readily manufactured. After the wafer is thinned, the wafer can be readily removed from the support, for example, at room temperature, that is, a fragile thin wafer can be readily manufactured. Another advantage is resistance to CVD because the thermosetting siloxane polymer layer is included as polymer layer (B).

BRIEF DESCRIPTION OF DRAWING

FIG. 1 is a cross-sectional view of a wafer processing laminate in one embodiment of the invention.

DESCRIPTION OF PREFERRED EMBODIMENT

There is a demand for a temporary bonding arrangement for wafer processing which facilitates to establish a temporary bond between a wafer and a support, enables to form an adhesive layer of uniform thickness even on a heavily stepped substrate, is compatible with the TSV forming and back surface interconnect forming steps, offers high resistance to wafer heating steps such as CVD, allows for easy removal, and enables to manufacture a thin wafer in a highly productive manner. The inventors have found a method for temporarily bonding a wafer having a circuit-forming front surface and a back surface to be processed to a support via a temporary bonding arrangement. A composite temporary adhesive layer of trilayer structure consisting of a thermoplastic temporary bond layer in the form of a non-silicone thermoplastic resin layer (A), a thermosetting temporary bond layer in the form of a thermosetting siloxane polymer layer (B), and a thermosetting temporary bond layer in the form of a thermosetting siloxane-modified polymer layer (C) is used between a wafer and a support in the order of (A), (B) and (C) from the wafer side. The method comprises the steps of providing a wafer laminate having a thermosetting silicone composition layer (B') for forming the thermosetting siloxane polymer layer (B), formed on the resin layer (A) which has been formed on the front surface of the wafer, providing a support laminate having a siloxane-containing composition layer (C') for forming the thermosetting siloxane-modified polymer layer (C), formed on the support, and joining and heating the thermosetting silicone composition layer (B') and the siloxane-containing composition layer (C') in vacuum for bonding and curing the layers together. Then a thin wafer having a TSV structure or bump connect structure can be readily manufactured.

In one embodiment of the invention, a laminate for wafer processing is shown in FIG. 1 as comprising a wafer (or device wafer) 1 to be processed, a support 3 for carrying the wafer 1 during its processing, and a composite temporary adhesive layer (or temporary bonding arrangement) 2 intervening between the wafer 1 and the support 3. The wafer 1 has a circuit-forming front surface and a back surface to be processed. The temporary bonding arrangement 2 has a trilayer structure consisting of a first temporary bond layer in the form of a non-silicone thermoplastic resin layer (A), a second temporary bond layer in the form of a thermosetting siloxane polymer layer (B), and a third temporary bond layer in the form of a thermosetting siloxane-modified polymer layer (C). The first temporary bond layer is releasably bonded to the front surface of the wafer 1. The third temporary bond layer is releasably bonded to the support 3.

The temporary bonding arrangement for wafer processing has a trilayer structure consisting of layers (A), (B) and (C). This embodiment is described below in detail although the invention is not limited thereto.

Composite Temporary Adhesive Layer

[First Temporary Bond Layer (A) in the Form of Non-Silicone Thermoplastic Resin Layer or Thermoplastic Organopolysiloxane-Free Polymer Layer]

The first temporary bond layer (A) is formed of a thermoplastic resin free of organopolysiloxane. In view of applicability to a stepped silicon wafer, a thermoplastic resin having good spin coating properties is advantageously used as the material of which first temporary bond layer (A) is made. In particular, thermoplastic resins having a glass transition temperature (Tg) of −80° C. to 120° C. are preferred, including olefin base thermoplastic elastomers, polybutadiene base thermoplastic elastomers, styrene base thermoplastic elastomers, styrene-butadiene base thermoplastic elastomers, and styrene-polyolefin base thermoplastic elastomers. Inter alia, hydrogenated polystyrene base elastomers are more preferred because of heat resistance. Such elastomers are commercially available under the trade name of Tuftece (Asahi Kassi Chemicals Corp.), Espolexe (Sumitomo Chemical Co., Ltd.), Rabalone (Mitsubishi Chemical Corp.), Septon® (Kuraray Co., Ltd.), and Dynarone (JSR Corp.). Also useful are cycloolefin polymers as typified by Zeonexs (Zeon Corp.) and cyclic olefin copolymers as typified by Topase (Polyplastics Co., Ltd.).

As mentioned above, the non-silicone thermoplastic resin layer (A) is preferably made of a non-silicone thermoplastic elastomer. Such a layer allows for easy release of the wafer from the support after thinning, suggesting ease of handling of a fragile thin wafer.

The non-silicone thermoplastic resin layer may be formed by dissolving a non-silicone thermoplastic resin in a solvent, and applying the solution onto a semiconductor substrate, typically silicon wafer by a suitable technique such as spin coating or spray coating. Suitable solvents include hydrocarbon solvents such as nonane, p-menthane, pinene, and isooctane. Inter alia, nonane, p-menthane, and isooctane are preferred for efficient coating. Although the coating thickness is not particularly limited, a resin coating is desirably formed so as to accommodate steps on the substrate. Preferably the resin is coated to a thickness of 0.5 to 50 µm, more preferably 0.5 to 10 µm. To the thermoplastic resin, an antioxidant for improving heat resistance and a surfactant for facilitating coating may be added. A typical antioxidant is di-t-butylphenol. Suitable surfactants include fluorosilicone surfactants, for example, X-70-1102 by Shin-Etsu Chemical Co., Ltd.

[Second Temporary Bond Layer (B) in the Form of Thermosetting Siloxane Polymer Layer or Thermosetting Silicone Polymer Layer]

The second temporary bond layer (B) constituting the wafer processing laminate or temporary bonding arrangement is a thermosetting siloxane polymer layer. It is not particularly limited as long as it is made of a thermosetting siloxane polymer. Preferably it is a cured layer of a thermosetting silicone composition comprising components (B-1), (B-2) and (B-3) and optional component (B-4), specifically (B-1) an organopolysiloxane having at least two alkenyl groups per molecule, (B-2) an organohydrogenpolysiloxane containing at least two silicon-bonded hydrogen atoms (Si—H groups) per molecule, in such an amount that a molar ratio of Si—H groups in component (B-2) to alkenyl groups in component (B-1) may range from 0.3/1 to 10/1, and (B-3) a platinum-based catalyst.

The thermosetting silicone composition layer (B') may further comprise (B-4) a reaction regulator in an amount of 0.1 to 10 parts by weight per 100 parts by weight of components (B-1) and (B-2) combined.

These components are described in more detail.

Component (B-1)

Component (B-1) is an organopolysiloxane having at least two alkenyl groups per molecule. Preferably it is a linear or branched diorganopolysiloxane having at least two alkenyl groups per molecule, more preferably a diorganopolysiloxane containing 0.3 to 10 mol %, especially 0.6 to 9 mol % of alkenyl groups per molecule. Notably mol % is a percent of moles of alkenyl groups per mole of Si.

Suitable diorganopolysiloxanes include those having the formulae (5) and (6).

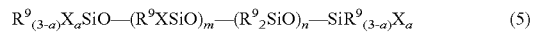

$$R^9{}_{(3-a)}X_aSiO—(R^9XSiO)_m—(R^9{}_2SiO)_n—SiR^9{}_{(3-a)}X_a \quad (5)$$

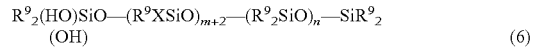

$$R^9{}_2(HO)SiO—(R^9XSiO)_{m+2}—(R^9{}_2SiO)_n—SiR^9{}_2(OH) \quad (6)$$

Herein $R^9$ is each independently a monovalent hydrocarbon group free of aliphatic unsaturation, X is each independently an alkenyl-containing monovalent organic group, a is an integer of 0 to 3, m is 0 or a positive number of up to 10, and n is a positive number of 1 to 1,000. In formula (5), 2a+m is such a number as to provide an alkenyl content per molecule of 0.3 to 10 mol %. In formula (6), m+2 is such a number as to provide an alkenyl content per molecule of 0.3 to 10 mol %.

$R^9$ is preferably a monovalent hydrocarbon group of 1 to carbon atoms, examples of which include alkyl groups such as methyl, ethyl, propyl and butyl, cycloalkyl groups such as cyclohexyl, and aryl groups such as phenyl and tolyl. Inter alia, alkyl and phenyl groups are preferred, especially methyl.

X is an alkenyl-containing monovalent organic group, preferably of 2 to 10 carbon atoms, examples of which include alkenyl groups such as vinyl, allyl, hexenyl and octenyl; (meth)acryloylalkyl groups such as acryloylpropyl, acryloylmethyl, and methacryloylpropyl; (meth)acryloxyalkyl groups such as acryloxypropyl, acryloxymethyl, methacryloxypropyl, and methacryloxymethyl; and alkenyl-containing monovalent hydrocarbon groups which may be separated by an oxygen atom such as cyclohexenylethyl and vinyloxypropyl. Industrially, vinyl is preferred.

In formula (5), "a" is an integer of 0 to 3. It is preferred that "a" be an integer of 1 to 3 because the polysiloxane is capped with alkenyl groups at ends of the molecular chain, indicating that reaction can be briefly completed by highly reactive terminal alkenyl groups. Industrially a=1 is most preferred for cost. The alkenyl-containing diorganopolysiloxane is preferably oily or gum-like while it may be linear or branched.

Component (B-2)

Component (B-2) is a crosslinker, specifically an organohydrogenpolysiloxane containing at least two silicon-bonded hydrogen atoms (Si—H groups) per molecule. The organohydrogenpolysiloxane should contain at least two, preferably 3 to 20 Si—H groups per molecule while it may be linear, branched or cyclic.

The organohydrogenpolysiloxane (B-2) should preferably have a viscosity at 25° C. of 1 to 5,000 mPa·s, more preferably 5 to 500 mPa·s, as measured by a rotational viscometer. A mixture of two or more organohydrogenpolysiloxanes is acceptable.

Component (B-2) is used in such an amount that a molar ratio of Si—H groups in component (B-2) to alkenyl groups in component (B-1), also referred to as SiH/alkenyl molar ratio, may range from 0.3/1 to 10/1, preferably from 1/1 to 8/1. When the SiH/alkenyl molar ratio is at least 0.3, problems including a lowering of crosslinking density and under-cure of the adhesive layer are avoided. When the SiH/alkenyl molar ratio is up to 10, an excessive increase of crosslinking density is avoided, a satisfactory tack or bond force is available, and the treating solution has a sufficient service life.

Component (8-3)

Component (B-3) is a platinum-based catalyst, that is, a platinum group metal-based catalyst. Included are chloroplatinio acid, alcohol solutions of chloroplatinic acid, the reaction products of chloroplatinic acid with alcohols, the reaction products of chloroplatinic acid with olefins, and the reaction products of ohloroplatinic acid with vinyl-containing siloxanes.

Component (B-3) is added in a catalytic amount. Preferably component (B-3) is added in an amount to provide 1 to 5,000 ppm, especially 5 to 2,000 ppm of platinum based on the total weight of components (B-1) and (B-2), or components (B-1), (B-2), and (B-4) if (B-4) is present. With at least 1 ppm of platinum, problems including under-cure of the composition, a lowering of crosslinking density and a lowering of retaining force are avoided. With up to 0.5% of platinum, the treating solution has a sufficient service life.

Component (B-4)

Component (B-4) is a reaction regulator, which is added, if necessary, for preventing the treating solution from thickening or gelling prior to heat curing when the composition is prepared or applied to the substrate.

Suitable reaction regulators include 3-methyl-1-butyn-3-ol, 3-methyl-1-pentyn-3-ol, 3,5-dimethyl-1-hexyn-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne 1-ethynyl-1-trimethylsiloxyoyolohexane, bis(2,2-dimethyl-3-butynoxy)dimethylsilane, 1,3,5,7-tetramethyl-1,3,5,7-tetravinylcyclotetrasiloxane, and 1,1,3,3-tetramethyl-1,3-divinyldisiloxane. Inter alia, 1-ethynylcyclohexanol and 3-methyl-1-butyn-3-ol are preferred.

Component (B-4), if used, is preferably added in an amount of 0.1 to 10 parts, more preferably 0.1 to 8.0 parts, and most preferably 0.1 to 2.0 parts by weight per 100 parts by weight of components (B-1) and (B-2) combined. When the amount of component (B-4) is up to 10 parts, the silicone adhesive composition remains fully curable. At least 0.1 part of component (B-4) is effective for exerting a reaction controlling effect.

To the thermosetting silicone composition layer (B'), a polyorganosiloxane comprising $R^{10}_3SiO_{0.5}$ units and $SiO_2$ units in a molar ratio of $R^{10}_3SiO_{0.5}$ unit/$SiO_2$ unit ranging from 0.3/1 to 1.8/1 may be added wherein $R^{10}$ is a substituted or unsubstituted monovalent hydrocarbon group of 1 to 10 carbon atoms. Such a polyorganosiloxane may be used in an amount of to 30% by weight based on component (B-1) and preferably 1 to 30% by weight when added.

The thermosetting silicone composition layer (B') may be formed by applying the composition in solution form onto the non-silicone thermoplastic resin layer (A) by a suitable technique such as spin coating or roll coating. When the thermosetting silicone composition layer (B') is formed on the non-silicone thermoplastic resin layer (A) by spin coating or the like, layer (B') is preferably coated in solution form. Suitable solvents include hydrocarbon solvents such as pentane, hexane, cyclohexane, isooctane, nonane, decane, p-menthane, pinene, isododecane, and limonene. To the solution of layer (B'), any well-known antioxidant may be added for improving heat resistance.

The silicone composition layer (B') is cured into a thermosetting siloxane polymer layer (B) which preferably has a thickness of 0.1 to 30 μm, more preferably 1.0 to 15 μm. A coating thickness of at least 0.1 μm ensures that when the silicone composition layer (B') is coated onto the non-silicone thermoplastic resin layer (A), the overall surface is coated without leaving uncoated spots. A coating with a thickness of up to 30 μm withstands the grinding step when a thin wafer is formed. To the thermosetting silicone composition layer (B'), a filler such as silica may be added for further increasing heat resistance, specifically in an amount of up to 50 parts by weight per 100 parts by weight of component (B-1).

The thermosetting siloxane polymer layer (B) obtained by curing the silicone composition layer (B') should preferably require a release force of 2 gf to 50 gf to peel it back at an angle of 180° from a test piece (typically polyimide test piece) of 25 mm wide. The peeling release force is more preferably 3 to 30 gf, even more preferably 5 to 20 gf. A release force of at least 2 gf eliminates the risk of the wafer being moved aside during wafer grinding whereas a release force of up to 50 gf ensures easy release of the wafer.

It is noted that when the procedure of immersing the wafer laminate in a solvent and thereafter releasing the support from the wafer is employed, a peeling release force of up to 70 gf ensures easy release of the support. This will be described later.

[Third Temporary Bond Layer (C) of Thermosetting Siloxane-Modified Polymer Layer]

The third temporary bond layer (C) constituting the wafer processing laminate or temporary bonding arrangement is a thermosetting siloxane-modified polymer layer. Although it is not particularly limited, it is preferably a cured layer of a siloxane-containing composition based on a thermosetting siloxane-modified polymer having the general formula (1) or (3).

Polymer of Formula (1)

The first preferred polymer is a phenolic siloxane polymer, specifically a siloxane bond-containing polymer comprising recurring units of formula (1) and having a weight average molecular weight of 3,000 to 500,000, preferably 10,000 to 100,000.

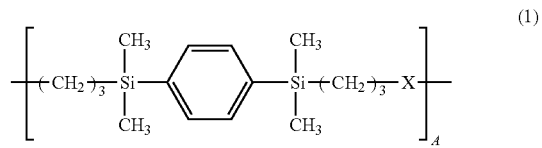

-continued

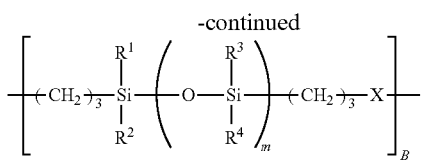

Herein $R^1$ to $R^4$ are each independently a monovalent hydrocarbon group of 1 to 8 carbon atoms, m is an integer of 1 to 100. B is a positive number, A is 0 or a positive number, A+B=1. Preferably A is 0 to 0.9, and B is 0.1 to 1. When units (A) are included, preferably A is 0.1 to 0.7, and B is 0.3 to 0.9. X is a divalent organic group having the general formula (2):

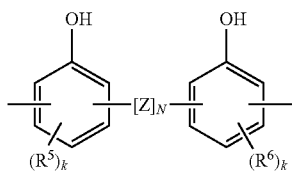

(2)

wherein Z is a divalent organic group selected from the following:

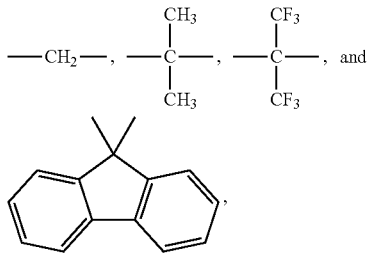

N is 0 or 1, $R^5$ and $R^6$ are each independently a $C_1$-$C_4$ alkyl or alkoxy group, and k is 0, 1 or 2.

Suitable groups of $R^1$ to $R^4$ include methyl, ethyl and phenyl. The subscript m is preferably an integer of 3 to 60, more preferably 8 to 40. B and A are preferably such numbers as to give a ratio B/A of 0/1 to 20/1, more preferably 0.5/1 to 5/1.

Polymer of Formula (3)

The second preferred polymer is an epoxy-modified siloxane polymer, specifically a siloxane bond-containing polymer comprising recurring units of formula (3) and having a weight average molecular weight of 3,000 to 500,000.

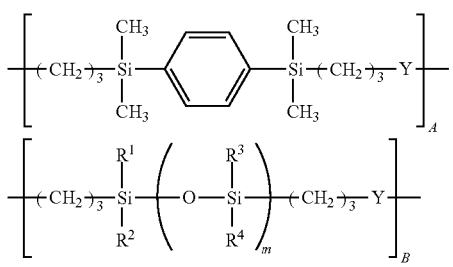

(3)

Herein $R^1$ to $R^4$ are each independently a monovalent hydrocarbon group of 1 to 8 carbon atoms, m is an integer of 1 to 100. B is a positive number, A is 0 or a positive number, and A+B=1. Preferably A is 0 to 0.9, and B is 0.1 to 1. When units (A) are included, preferably A is 0.1 to 0.7, and B is 0.3 to 0.9. Y is a divalent organic group having the general formula (4):

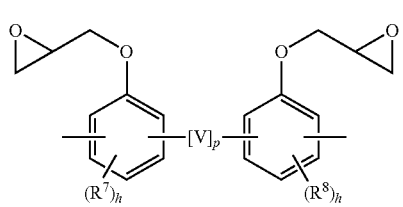

(4)

wherein V is a divalent organic group selected from the following:

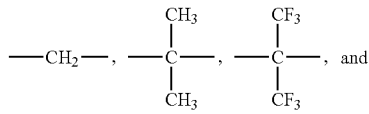

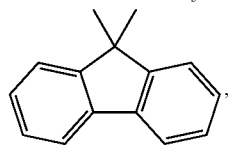

p is 0 or 1, $R^7$ and $R^8$ are each independently a $C_1$-$C_4$ alkyl or alkoxy group, and h is 0, 1 or 2.

Exemplary groups of $R^1$ to $R^4$ and suitable values of m are as described above for formula (1).

The thermosetting siloxane composition composed mainly of the thermosetting siloxane-modified polymer of formula (1) or (3) defined above contains a crosslinker for the thermosetting purpose. For the phenolic siloxane polymer of formula (1), the crosslinker is at least one member selected from among an amino condensate, melamine resin or urea resin modified with formaldehyde or formaldehyde-alcohol, a phenol compound having on average at least two methylol or alkoxymethylol groups per molecule, and an epoxy compound having on average at least two epoxy groups per molecule.

The amino condensate, melamine resin and urea resin which are modified with formaldehyde or formaldehyde-alcohol are preferred crosslinkers. For example, the melamine resin (or condensate) modified with formaldehyde or formaldehyde-alcohol may be obtained by effecting addition polycondensation of a modified melamine monomer (e.g., trimethoxymethylmonomethylolmelamine) or oligomer thereof (e.g., dimer, trimer) with formaldehyde by a well-known technique until the desired molecular weight is reached. The melamine resin may be used alone or in admixture.

The urea resin (or condensate) modified with formaldehyde or formaldehyde-alcohol may be obtained by modifying a urea condensate having a selected molecular weight with formaldehyde into a methylol form by a well-known technique, and optionally further modifying the methylol form condensate with an alcohol into an alkoxy form. Examples of the urea resin modified with formaldehyde or formaldehyde-alcohol include methoxymethylated urea condensates, ethoxymethylated urea condensates, and propoxymethylated urea condensates. The urea resin may be used alone or in admixture.

Examples of the phenol compound having on average at least two methylol or alkoxymethylol groups per molecule include (2-hydroxy-5-methyl)-1,3-benzene dimethanol and 2,2',6,6'-tetramethoxymethyl bisphenol A. The phenol compound may be used alone or in admixture.

For the epoxy-modified siloxane polymer of formula (3), the crosslinker is at least one member selected from among a phenol compound having on average at least two phenolic hydroxyl groups per molecule and an epoxy compound having on average at least two epoxy groups per molecule.

Preferred epoxy compounds having at least two epoxy groups for use with the polymers of formulae (1) and (3) as the orosslinker include, but are not limited to, multi-functional epoxy resins having a functionality of 2, 3, 4 or more, for example, those resins commercially available under the trade name of EOCN-1020, EOCN-102S, XD-1000. NC-2000-L. EPPN-201, GAN and NC6000 from Nippon Kayaku Co., Ltd. Crosslinkers of the following formulae are also useful.

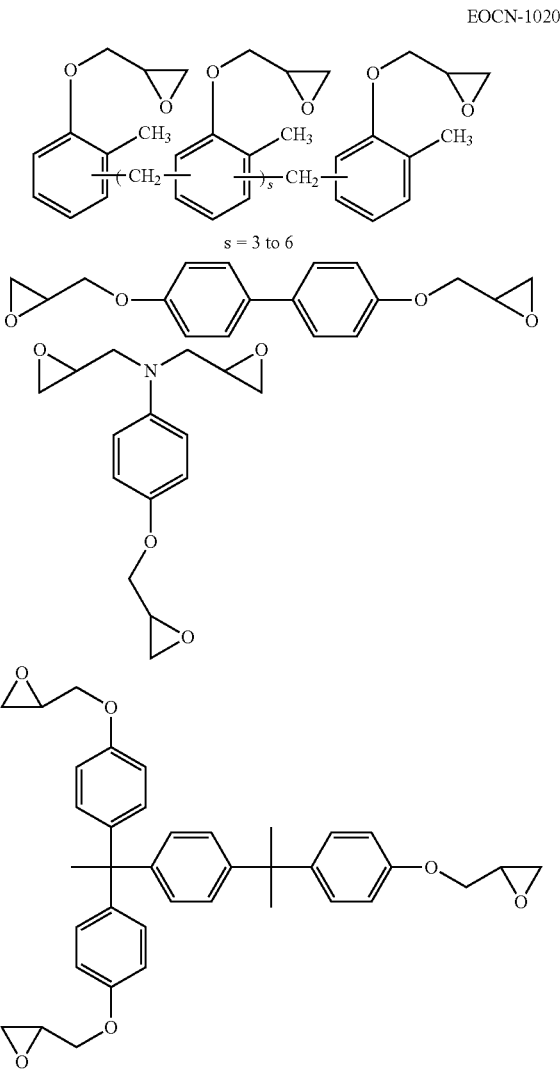

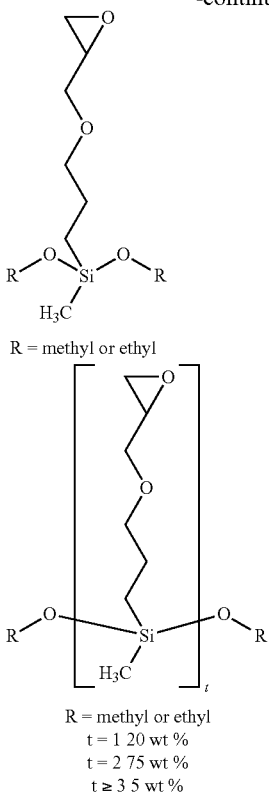

Suitable crosslinkers for use with the epoxy-modified siloxane polymer of formula (3) include m and p-cresol novolak resins, e.g., EP-6030G from Asahi Organic Chemicals Industry Co., Ltd., trifunctional phenol compounds, e.g., Tris-P-PA from Honshu Chemical Industry Co., Ltd., and tetrafunctional phenol compounds, e.g., TEP-TPA from Asahi Organic Chemicals Industry Co., Ltd.

The crosslinker is added in an amount of 0.1 to 50 parts, preferably 0.1 to 30 parts, and more preferably 1 to parts by weight per 100 parts by weight of the siloxane-modified polymer. The crosslinker may be added in admixture of two or more.

To the composition, a curing catalyst such as acid anhydride may be added in an amount of up to 10 parts by weight per 100 parts by weight of the siloxane-modified polymer.

The siloxane-containing composition may be dissolved in a solvent to form a solution which is applied to a support by a suitable coating technique such as spin coating, roll coating or die coating. Examples of the solvent used herein include ketones such as cyclohexanone, cyolopentanone, and methyl-2-n-amylketone, alcohols such as 3-methoxybutanol, 3-methyl-3-methoxybutanol, 1-methoxy-2-propanol, and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether, and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, which may be used alone or in admixture.

Notably, any well-known antioxidants and fillers such as silica may be added to the composition in an amount of up to 50 parts by weight per 100 parts by weight of the siloxane-modified polymer for further enhancing heat resistance. Also a surfactant may be added for improving coating uniformity. Exemplary of the antioxidant which can be added to the siloxane-containing composition layer (C') are hindered phenol compounds such as tetrakis[methylene-(3, 5-di-t-butyl-4-hydroxyhydrocinnamate)]methane (trade name Adekastab® AO-60 from Adeka Corp.).

The siloxane-containing composition layer (C') composed mainly of the thermosetting siloxane-modified polymer is preferably deposited such that the cured thickness is in the range of 15 to 150 μm, more preferably 20 to 120 μm, depending on steps on the wafer. When the layer (C') is at least 15 μm, it withstands the grinding step for the thinning of a wafer. When the layer (C') is up to 150 μm, it is practically acceptable because the risk of deformation during the heat treatment step such as TSV forming step is eliminated.

Thin Wafer Manufacturing Method

A further embodiment of the invention is a method for manufacturing a thin wafer, which is characterized in that a composite temporary adhesive layer (or temporary bonding arrangement) consisting of three layers, non-silicone thermoplastic resin layer (A), thermosetting siloxane polymer layer (B), and thermosetting siloxane-modified polymer layer (C) defined above is used as a bond layer between a wafer (having a semiconductor circuit formed therein) and a support. The thin wafer manufactured by the method typically has a thickness of 5 to 300 μm, more typically 10 to 100 μm.

The method for manufacturing a thin wafer from a starting wafer comprises steps (a) to (f), and optionally steps (g) to (i). The starting wafer has a circuit-forming front surface and a non-circuit-forming back surface.

First, the wafer at its circuit-forming front surface is bonded to a support via a temporary bonding arrangement, i.e., composite temporary adhesive layer of trilayer structure consisting of a non-silicone thermoplastic resin layer (A), a thermosetting siloxane polymer layer (B), and a thermosetting siloxane-modified polymer layer (C).

Step (a):

Step (a) involves forming a first temporary bond layer of a non-silicone thermoplastic resin (A) on the circuit-forming front surface of the wafer, forming a thermosetting silicone composition layer (B') thereon, forming a siloxane-containing composition layer (C') on one surface of a support, and joining the thermosetting silicone composition layer (B') on the wafer to the siloxane-containing composition layer (C') on the support in vacuum.

A wafer having a circuit-forming front surface and a non-circuit-forming back surface is provided. The wafer has a pair of opposed surfaces, that is, a front surface where a semiconductor circuit is formed and a back surface where a semiconductor circuit is not formed. The wafer which can be used herein is typically a semiconductor wafer. Suitable semiconductor wafers include silicon wafers, germanium wafers, gallium-arsenic wafers, gallium-phosphorus wafers, and gallium-arsenic-aluminum wafers. Although the thickness of the wafer is not particularly limited, it is typically 600 to 800 μm, more typically 625 to 775 μm.

The support which can be used herein may be selected from substrates such as silicon wafers, glass substrates, and quartz wafers. In the practice of the invention, the support need not be light transmissive because there is no need to irradiate energy radiation to the temporary adhesive layer through the support.

The layers (A), (B') and (C') may be pre-formed as films, which may be attached to the wafer or the support. Alternatively, their solutions may be applied to the wafer or the support by a suitable coating technique such as spin coating or roll coating. After coating, prebake is performed at a temperature of 80 to 200° C., preferably 100 to 180° C., depending on the volatility of a particular solvent used. The resulting coated product is ready for use.

The wafer having layers (A) and (B') formed thereon and the support having layer (C') formed thereon are joined together into an assembly by curing the layers to bond the wafer to the support via layers (A), (B) and (C). First, layer (A) is formed on the wafer, and layer (B') is formed on layer (A), yielding a layer (A)-(B'). Separately, layer (C') is formed on the support. Thereafter, layer (A)-(B') and layer (C') are joined and cured for bonding, yielding a composite temporary adhesive layer consisting of layers (A)-(B) and (C) and having a bonding interface (B/C).

The assembly is uniformly compressed preferably at a temperature of 40 to 200° C., more preferably 60 to 180° C. in vacuum to complete a wafer processing laminate (bonded wafer/support assembly). The vacuum condition may be a reduced pressure, which is typically 0.01 to 500 Pa, preferably 0.01 to 100 Pa. Also preferably compression is under a pressure of 0.1 to 50 kN. The wafer bonding system used herein includes commercially available wafer bonders such as EVG520IS and 850 TB from EV Group.

Step (b):

Step (b) involves heat curing the thermosetting silicone composition layer (B') and the siloxane-containing composition layer (C') for thereby bonding a second temporary bond layer in the form of a thermosetting siloxane polymer layer (B) which is the cured product of the thermosetting silicone composition layer (B') to a third temporary bond layer in the form of a thermosetting siloxane-modified polymer layer (C) which is the cured product of the siloxane-containing composition layer (C'). As a result of step (b), there is obtained a composite temporary adhesive layer of trilayer structure consisting of the first, second and third temporary bond layers via which the wafer is bonded to the support. After the wafer processing laminate is formed in step (a), it is heated at a temperature of 120 to 220° C., preferably 150 to 200° C. for 10 minutes to 4 hours, preferably 30 minutes to 2 hours, for curing layers (B') and (C').

Step (c):

Following is step (c) of grinding or polishing the non-circuit-forming surface of the wafer bonded to the support via the composite temporary adhesive layer of trilayer structure consisting of first, second and third bond layers. Step (c) is intended to reduce the thickness of the wafer by grinding the wafer back surface of the wafer processing laminate resulting from step (b). The technique of grinding the wafer back surface is not particularly limited, and any well-known grinding techniques may be used. The wafer is ground by a grinding wheel (e.g., diamond grinding wheel), while preferably feeding water to the wafer and the wheel for cooling. As the means for grinding the wafer back surface, for example, a surface grinder DAG-810 by DISCO Co., Ltd. may be used. The wafer back surface may also be subjected to chemical mechanical polishing (CMP).

Step (d):

Step (d) is to process the non-circuit-forming surface of the wafer processing laminate which has been ground, i.e., the non-circuit-forming surface of the wafer which has been thinned by back surface grinding (a). This step includes various processes which can be applied on the wafer level, for example, electrode formation, metal conductor formation, and protective film formation. More specifically, any conventional well-known processes may be applied, including metal sputtering for forming electrodes or the like, wet etching of a sputtered metal layer, formation of a pattern (serving as a mask for metal conductor formation) by resist coating, exposure and development, removal of resist, dry etching, metallization, silicon etching for TSV formation, oxide film formation on silicon surface.

Step (e):

Step (e) is to release the wafer which has been processed in step (d) from the composite temporary adhesive layer and the support, that is, separating the thin wafer from the support after processing and before dicing. This release procedure is typically performed at a relatively low temperature from room temperature to about 60° C. Suitable release procedures for separating the wafer from the support include, but are not limited to, a pull-up procedure of holding the wafer or support of the wafer processing laminate horizontally, and pulling up the support or wafer at an angle relative to the horizon, and a peeling procedure of adhering a protective film to the ground surface of the wafer and peeling the protective film together with the wafer from the wafer processing laminate.

Either of these procedures may be used in the release step (e). Typically, the release step is at room temperature.

Preferably the step (e) of releasing the processed wafer from the support includes sub-steps of (g) attaching a dicing tape to the processed surface of the wafer, (h) vacuum chucking the dicing tape-attached surface to a chuck surface, and (i) releasing the support from the processed wafer by peel-off while keeping the chuck surface at a temperature in the range of 10 to 100° C. The series of sub-steps allow the support to be readily separated from the processed wafer and facilitate the subsequent dicing step.

In a preferred embodiment, the overall wafer/support assembly is immersed in a solvent prior to step (e) of releasing the support from the wafer. During the solvent immersion, a peripheral portion of the temporary adhesive layer on the wafer is swollen and even dissolved, making it easier to remove the support from the wafer. Any solvent may be used in the immersion step as long as layer (A) or non-silicone thermoplastic resin layer in the composite temporary bond layer can be swollen and dissolved in the solvent. Suitable solvents include pentane, hexane, cyclohexane, decane, isononane, p-menthane, pinene, isododecane, and limonene, which may be used alone or in admixture.

Step (f):

Step (e) of releasing the processed wafer from the support is followed by step (f) of cleaning the wafer to remove any temporary adhesive layer remaining on its circuit-forming surface. Sometimes the temporary adhesive layer (A) remains, in part, on the circuit-forming surface of the wafer which has been released from the support during step (e), and in this event, the residual adhesive layer (A) must be removed. Removal of residual layer (A) may be performed by washing the wafer, for example.

Step (f) may use any cleaning fluid which is capable of dissolving the non-silicone thermoplastic resin of which layer (A) is made. Suitable solvents include pentane, hexane, cyclohexane, decane, isononane, p-menthane, pinene, isodecane, and limonene, which may be used alone or in admixture. If removal is difficult, a base or acid may be added to the solvent. Suitable bases include amines such as ethanolamine, diethanolamine, triethanolamine, triethylamine, and ammonia, and ammonium salts such as tetramethylammnonium hydroxide. Suitable acids include organic acids such as acetic acid, oxalic acid, benzenesulfonic acid, and dodecylbenzenesulfonic acid. The base or acid is typically added in such amounts as to give a concentration of 0.01 to 10%, preferably 0.1 to 5% by weight in the cleaning fluid. For more efficient removal of residues, any known surfactants may be added to the cleaning fluid.

The cleaning step may be carried out by any well-known procedures, for example, by agitating the fluid with a puddle, spraying the fluid, immersing in a cleaning fluid bath, or cleaning with two fluids. The two-fluid cleaning is preferred because cleaning can be performed under high pressure so that any residual resin may be briefly removed.

Preferably nitrogen is mixed with the cleaning fluid. The cleaning time is preferably 5 seconds to 10 minutes, more preferably 10 seconds to 5 minutes. The temperature is preferably 10 to 80° C., more preferably 15 to 65° C. If desired, the dissolution of layer (A) in the cleaning fluid may be followed by rinsing with water or alcohol (typically $C_1$-$C_5$ alcohol) and drying, yielding a thin wafer.

EXAMPLE

Examples of the invention are given below by way of illustration and not by way of limitation. All parts are by weight. Mw is weight average molecular weight as measured by gel permeation chromatography (GPC) versus polystyrene standards.

Resin Synthesis Example 1

A flask equipped with a stirrer, thermometer, nitrogen purge line and reflux condenser was charged with 43.1 g of 9,9'-bis(3-allyl-4-hydroxyphenyl)fluorene (M-1), 29.5 g of organohydrogensiloxane having the average structural formula (M-3), 135 g of toluene, and 0.04 g of chloroplatinic acid and heated at 80° C. Then, 17.5 g of 1,4-bis(dimethylsilyl)benzene (M-5) was added dropwise to the flask over 1 hour, during which the flask internal temperature rose to 85° C. At the end of dropwise addition, the solution was aged at 80° C. for 2 hours. Toluene was distilled off, and instead, 80 g of cyclohexanone was added to form a resin solution having a resin solid concentration of 50 wt % in cyclohexane solvent. The molecular weight of the resin in the solution was determined by GPC, finding a Mw of 45,000. To 50 g of the resin solution were added 7.5 g of an epoxy compound (EOCN-1020 by Nippon Kayaku Co., Ltd.) as crosslinker, 0.2 g of bis(tert-butylsulfonyl)diazomethane (BSDM, available from Wako Pure Chemical Industries, Ltd.) as cure catalyst, and 0.1 g of tetrakis[methylene-(3,5-di-t-butyl-4-hydroxy-hydrocinnamate)]methane (Adekastab AO-60 By Adeka Corp.) as antioxidant. Filtration through a membrane filter having a pore size of 1 μm yielded a siloxane-containing composition solution (C-1).

Resin Synthesis Example 2

In a 5-L flask equipped with a stirrer, thermometer, nitrogen purge line and reflux condenser, 84.1 g of epoxy compound (M-2) was dissolved in 600 g of toluene. Then 294.6 g of compound (M-3) and 25.5 g of compound (M-4) were added to the flask, which was heated at 60° C. Then 1 g of platinum catalyst on carbon (5 wt %) was added. It was seen that the internal temperature rose to 65-67° C. Thereafter, the flask was further heated at 90° C., held at the temperature for 3 hours, and cooled to room temperature. To the reaction solution was added 600 g of methyl isobutyl ketone (MIBK). The reaction solution was passed through a filter under pressure to remove the platinum catalyst. Once the solvent was distilled off in vacuum from the polymer solution, propylene glycol monomethyl ether acetate (PGNEA) was added to the residue to form a resin solution in PGMEA having a solid concentration of 60 wt %. The molecular weight of the resin in the solution was determined by GPC, finding a Mw of 28,000. To 100 g of the resin solution were added 9 g of tetrafunctional phenol compound (TEP-TPA by Asahi Organic Chemical Industry Co., Ltd.) and 0.2 g of tetrahydrophthalic anhydride (Rikaoid HH-A by New Japan Chemical Co., Ltd.). Filtration through a membrane filter with a pore size of 1 μm yielded a siloxane-containing composition solution (C-2).

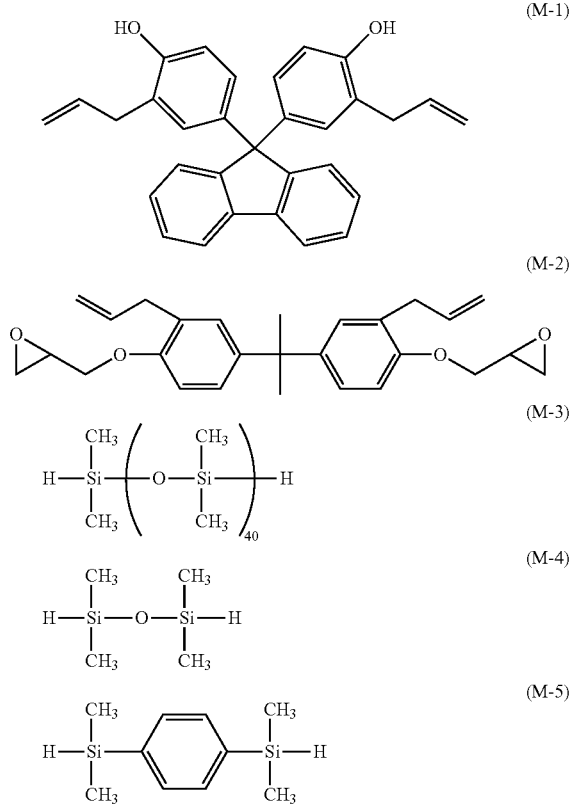

Resin Solution Preparation Example 1

Thermoplastic hydrogenated polystyrene based resin (Septon® 4033 by Kuraray Co., Ltd.), 16 g, was dissolved in 184 g of isononane to form a 8 wt % isononane solution of Septon® 4033. The solution was filtered through a membrane filter having a pore size of 0.2 μm, yielding an isononane solution (A-1) of non-silicone thermoplastic resin.

Resin Solution Preparation Example 2

Thermoplastic hydrogenated polystyrene based resin (Septon® 4033 by Kuraray Co., Ltd.), 24 g, was dissolved in 176 g of isononane to form a 12 wt % isononane solution of Septon® 4033. The solution was filtered through a membrane filter having a pore size of 0.2 m, yielding an isononane solution (A-2) of non-silicone thermoplastic resin.

Resin Solution Preparation Example 3

To a solution of 80 parts of polydimethylsiloxane containing 0.5 mol % vinyl groups on side chain and having a number average molecular weight (Mn) of 30,000 and 400 parts of isododecane were added 3.0 parts of organohydrogen-polysiloxane having formula (M-6) and 0.7 part of ethynyl cyclohexanol. Further, 0.5 part of platinum catalyst (CAT-PL-5 by Shin-Etsu Chemical Co., Ltd.) was added to the mixture, which was filtered through a membrane filter having a pore size of 0.2 μm to yield a thermosetting silicone composition solution (B-1).

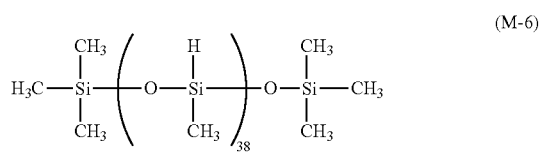

Resin Solution Preparation Example 4

To a solution of 80 parts of polydimethylsiloxane containing 0.5 mol % vinyl groups on side chain and having a Mn of 30.000 and 400 parts of isododecane were added 5.0 parts of organohydrogenpolysiloxane (M-6) and 0.7 part of ethynyl cyclohexanol. Further, 0.5 part of platinum catalyst (CAT-PL-5) was added to the mixture, which was filtered through a membrane filter having a pore size of 0.2 μm to yield a thermosetting silicone composition solution (B-2).

Resin Solution Preparation Example 5

To a solution of 80 parts of polydimethylsiloxane containing 0.5 mol % vinyl groups at both ends and side chain and having a Mn of 30,000 and 400 parts of isododecane were added 7.5 parts of organohydrogenpolysiloxane (M-6) and 0.7 part of ethynyl cyclohexanol. Further, 0.5 part of platinum catalyst (CAT-PL-5) was added to the mixture, which was filtered through a membrane filter having a pore size of 0.2 μm to yield a thermosetting silicone composition solution (B-3).

Resin Solution Preparation Example 6

To a solution of 80 parts of polydimethylsiloxane containing 0.5 mol % vinyl groups at both ends and side chain and having a Mn of 30,000 and 400 parts of isododecane were added 10 parts of organohydrogenpolysiloxane (M-6) and 0.7 part of ethynyl cyclohexanol. Further, 0.5 part of platinum catalyst (CAT-PL-5) was added to the mixture, which was filtered through a membrane filter having a pore size of 0.2 μm to yield a thermosetting silicone composition solution (B-4).

Examples 1 to 5 and Comparative Examples 1 to 2

The wafer used herein was a silicon wafer (diameter 200 mm, thickness 725 μm) having copper posts (diameter 40 μm, height 10 μm) distributed over its entire surface. Thermoplastic resin solution (A-1) was spin coated onto the wafer and heated on a hot plate at 150° C. for 5 minutes to form a coating (to form layer (A)) having a thickness shown in Table 1 on the bump-formed surface of the wafer. Thereafter, thermosetting silicone composition solution (B-1) corresponding to layer (B') was applied onto layer (A) by spin coating again and heated on a hot plate at 150° C. for 3 minutes to form a coating having a thickness shown in Table 1.

The support used herein was a glass plate (diameter 200 mm, thickness 500 μm). The siloxane-containing composition solution (C-1) corresponding to layer (C') was spin coated on the support and heated on a hot plate at 150° C. for 5 minutes to form a coating having a thickness shown in Table 1 on the glass support.

Using a vacuum wafer bonder EVG520IS (EV Group) under a reduced pressure of up to $10^{-3}$ mbar, the silicon wafer having non-silicone thermoplastic resin layer (A) and layer (B') was joined to the glass plate having siloxane-containing composition layer (C') or thermosetting siloxane-modified polymer layer, with their resin layers mated together, under the pressure bonding condition shown in Table 1. In this way, there was obtained a wafer processing laminate having a bonding interface B'/C'. The same procedure as above was followed in Examples 2 to 5.

For comparison sake, the siloxane-containing composition layer (C') of thermosetting siloxane-modified polymer was formed on the support, after which thermosetting silicone composition layer (B-1) or (B-2) was formed thereon. The silicon wafer having thermoplastic resin layer (A) was joined to the support having layers (C') and (B'). There was obtained a wafer processing laminate having a bonding interface A/B'.

It is noted that although a glass plate is used herein as the support so that any defects after bonding are detectable, a silicon substrate such as silicon wafer which is not transmissive to light may be used as the support.

The laminate was examined by the following tests. The results of Examples and Comparative Examples are shown in Table 1. The tests were carried out in the following order.

Adhesion Test

Using a wafer bonder EVG520IS of EV Group, a wafer with a diameter of 200 mm was bonded to a support under conditions including a bonding temperature as shown in Table 1, a chamber internal pressure of less than $10^{-3}$ mbar, and a load of 5 kN. After bonding, the laminate was heated in an oven at 180° C. for 1 hour for curing layers (B') and (C'). After cooling to room temperature, the bond state at the interface was observed visually and under an optical microscope. The sample was evaluated good (0) when no defectives like bubbles were found at the interface, and poor (X) when defectives were found.

Back Surface Grinding Test

The back surface of a silicon wafer was ground by a grinder DAG810 of DISCO Co., Ltd. having a diamond abrasive wheel. After the wafer was ground to a final thickness of 50 μm, it was observed for defectives such as cracks and dislodgment under an optical microscope (100×). The sample was evaluated good (○) when no defectives were found, and poor (X) when defectives were found.

CVD Resistance Test

After the silicon wafer had been ground, the laminate was placed in a CVD system where a $SiO_2$ film was deposited to a thickness of 2 μm. The outer appearance of the laminate was observed for anomaly. The sample was evaluated good (○) when no appearance anomalies were found, and poor (X) when appearance anomalies (void formation, wafer bulging or wafer rupture) were found. The CVD resistance test conditions are shown below.

System: plasma-enhanced CVD PD270STL by Samco Inc.

RF 500 W
Internal pressure 40 Pa
TEOS (tetraethyl orthosilicate): $O_2$=20:680 socm Peel Test The wafer release ability was evaluated. Following the CVD resistance test, a dicing tape was applied to the surface of the wafer which had been thinned to 50 μm, using a dicing frame. The dicing tape was set to the chuck platen by vacuum chucking. At room temperature, the glass plate was peeled by pulling it up at one point using a pair of tweezers. The sample was evaluated good (○) when the glass plate was peeled without breakage of the 50-μm wafer, and poor (X) when fissure or other anomalies occurred in the wafer. In another run, the assembly was immersed in p-menthane at room temperature for 5 minutes before the peel test.

Clean-Up Test

After the peel test, the 200-mm wafer mounted on the dicing frame via the dicing tape (which had been exposed to the CVD resistance test conditions) was set on a spin coater, with the adhesive layer upside. The test used p-menthane as cleaning fluid and included three modes: 5 minutes spraying, 1 minute spraying, and 1 minute two-fluid cleaning (nitrogen mixed). For the two-fluid cleaning, Delta 12L (by Suss MicroTec AG) was used. Rinsing was then performed by spraying isopropyl alcohol (IPA) while spinning the wafer. The outer appearance of the wafer was visually observed for any residual adhesive resin. The sample was evaluated good (○) in the absence of residual resin, fair (Δ) in the local presence of residual resin, and poor (X) in the presence of residual resin over the entire wafer surface.

Measurement of Release Force by Peeling

The material corresponding to layer (A) was spin coated on a silicon wafer (diameter 200 mm, thickness 725 μm) and heated on a hot plate at 150° C. for 5 minutes, to form a coating having a thickness shown in Table 1 on the bump-formed surface of the wafer. Thereafter, the thermosetting silicone composition solution corresponding to layer (B') was applied onto layer (A) on the silicon wafer by spin coating again and heated on a hot plate at 150° C. for 3 minutes, to form a coating of 2 μm thick. The siloxane-containing composition solution corresponding to layer (C') was spin coated on layer (B') and heated on a hot plate at 150° C. for 5 minutes to form a coating of 50 μm thick on the silicon wafer. The three-layer structure was cured by heating in an oven at 180° C. for 1 hour.

Five strips (150 mm long×25 mm wide) of polyimide tape were attached to layer (C) on the wafer, after which the temporary adhesive layer in the open regions between the tape strips was removed. Using Autograph AG-1 (Shimadzu Corp.), the tape strip was peeled back at an angle of 180° and at a rate of 300 mm/min over a stroke of 120 mm from its one end. An average of forces required to peel (120 mm stroke, 5 strips) was computed and reported as release force of temporary bond layer (B).

TABLE 1

|  | Example | | | | | Comparative Example | |
|---|---|---|---|---|---|---|---|
|  | 1 | 2 | 3 | 4 | 5 | 1 | 2 |
| Resin layer (A) | A-1 | A-2 | A-2 | A-2 | A-2 | A-2 | A-2 |
| Thickness of layer (A) | 2 μm | 5 μm | 5 μm | 5 μm | 5 μm | 5 μm | 5 μm |
| Resin layer (B') | B-1 | B-1 | B-2 | B-3 | B-4 | B-1 | B-2 |
| Thickness of layer (B) | 5 μm | 5 μm | 10 μm | 15 μm | 20 μm | 5 μm | 10 μm |
| Peeling release force of layer (B) | 5 gf | 5 gf | 10 gf | 30 gf | 70 gf | 5 gf | 10 gf |

TABLE 1-continued

|  |  | Example | | | | | Comparative Example | |
|---|---|---|---|---|---|---|---|---|
|  |  | 1 | 2 | 3 | 4 | 5 | 1 | 2 |
| SiH/alkenyl molar ratio | | 0.75 | 0.75 | 1.25 | 1.87 | 2.5 | 0.75 | 1.25 |
| Resin layer (C') | | C-1 | C-1 | C-2 | C-1 | C-1 | C-1 | C-1 |
| Thickness of layer (C) | | 60 μm | 60 μm | 60 μm | 60 μm | 60 μm | 60 μm | 60 μm |
| Bonding interface | | B'/C' | B'/C' | B'/C' | B'/C' | B'/C' | A/C' | A/C' |
| Bonding temperature | | 120° C. | 120° C. | 140° C. | 120° C. | 120° C. | 120° C. | 120° C. |
| Coating uniformity | | <2 μm | <2 μm | <3 μm | <2 μm | <2 μm | <2 μm | <2 μm |
| Bond | visual observation | ○ | ○ | ○ | ○ | ○ | ○ | ○ |
|  | optical microscope | ○ | ○ | ○ | ○ | ○ | x | x |
|  | Resistance to back surface grinding | ○ | ○ | ○ | ○ | ○ | — | — |
|  | CVD resistance | ○ | ○ | ○ | ○ | ○ | — | — |
| Release | no solvent immersion | ○ | ○ | ○ | ○ | x | — | — |
|  | after solvent immersion (p-menthene/5 min) | ○ | ○ | ○ | ○ | ○ | — | — |
| Clean-up test | 5 min spraying | ○ | ○ | ○ | ○ | ○ | — | — |
|  | 1 min spraying | ○ | Δ | Δ | Δ | Δ | — | — |
|  | 1 min two-fluid cleaning | ○ | ○ | ○ | ○ | ○ | — | — |

As is evident from Table 1, Examples 1 to 4 within the scope of the invention provide a secure temporary bond and smooth release. In Example 5, the assembly is immersed in a solvent before the wafer can be released from the support. In Comparative Examples 1 and 2 outside the scope of the invention, it was observed under optical microscope that voids generated after bonding.

While the invention has been illustrated and described in typical embodiments, it is not intended to be limited to the details shown. Various other embodiments, additions, and modifications may occur to persons skilled in the art. All such embodiments fall within the spirit and scope of the invention as long as the effects and benefits of the invention are achieved.

Japanese Patent Application No. 2014-259813 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for temporarily bonding a wafer having a circuit-forming front surface and a back surface to be processed to a support via a temporary bonding arrangement, said temporary bonding arrangement being a composite temporary adhesive layer of trilayer structure consisting of a first temporary bond layer in the form of a non-silicone thermoplastic resin layer (A) which is releasably bonded to the front surface of the wafer, a second temporary bond layer in the form of a thermosetting siloxane polymer layer (B) laid on the first temporary bond layer, and a third temporary bond layer in the form of a thermosetting siloxane-modified polymer layer (C) releasably bonded to the support, said method comprising the steps of:

providing a wafer laminate having a thermosetting silicone composition layer (B') for forming the thermosetting siloxane polymer layer (B), formed on the resin layer (A) which has been formed on the front surface of the wafer, providing a support laminate having a siloxane-containing composition layer (C') for forming the thermosetting siloxane-modified polymer layer (C), formed on the support, and joining and heating the thermosetting silicone composition layer (B') and the siloxane-containing composition layer (C') in vacuum for bonding and curing the layers together.

2. The method of claim 1 wherein the step of joining and heating in vacuum is at a temperature of 40 to 200° C.

3. The method of claim 1 wherein the thermosetting silicone composition layer (B') is a layer of a composition comprising
  (B-1) an organopolysiloxane having at least two alkenyl groups per molecule,
  (B-2) an organohydrogenpolysiloxane containing at least two silicon-bonded hydrogen atoms (Si—H groups) per molecule, in such an amount that a molar ratio of Si—H groups in component (B-2) to alkenyl groups in component (B-1) may range from 0.3/1 to 10/1, and
  (B-3) a platinum-based catalyst.

4. The method of claim 1 wherein the thermosetting siloxane polymer layer (B) requires a release force of 2 gf to 50 gf to peel it back at 180° from a polyimide test piece of 25 mm wide.

5. The method of claim 1 wherein the siloxane-containing composition layer (C') is a layer of a composition comprising 100 parts by weight of a siloxane bond-containing polymer comprising recurring units of the general formula (1) and having a weight average molecular weight of 3,000 to 500,000, and 0.1 to 50 parts by weight of a crosslinker which is selected from the group consisting of an amino condensate, melamine resin or urea resin modified with formaldehyde or formaldehyde-alcohol, a phenol compound having on average at least two methylol or alkoxymethylol groups per molecule, and an epoxy compound having on average at least two epoxy groups per molecule,

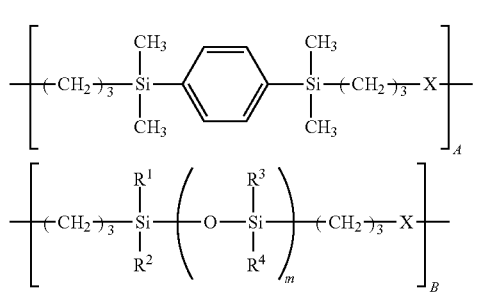

(1)

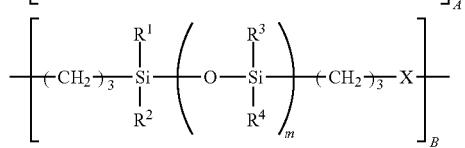

wherein $R^1$ to $R^4$ are each independently a monovalent hydrocarbon group of 1 to 8 carbon atoms, m is an integer of 1 to 100, B is a positive number, A is 0 or a positive number, A+B=1, and X is a divalent organic group having the general formula (2):

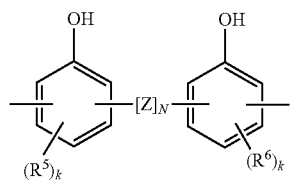

(2)

wherein Z is a divalent organic group selected from the following:

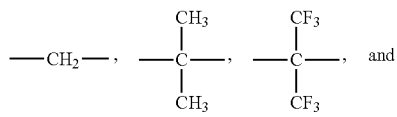

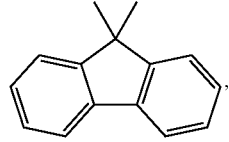

N is 0 or 1, $R^5$ and $R^6$ are each independently an alkyl or alkoxy group of 1 to 4 carbon atoms, and k is 0, 1 or 2.

6. The method of claim 1 wherein the siloxane-containing composition layer (C') is a layer of a composition comprising 100 parts by weight of a siloxane bond-containing polymer comprising recurring units of the general formula (3) and having a weight average molecular weight of 3,000 to 500,000, and 0.1 to 50 parts by weight of a crosslinker which is selected from the group consisting of a phenol compound having on average at least two phenolic hydroxyl groups per molecule and an epoxy compound having on average at least two epoxy groups per molecule,

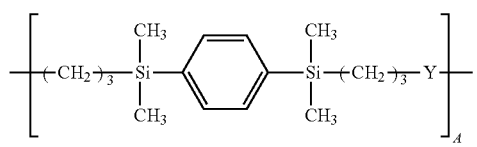

(3)

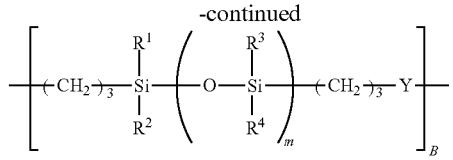

wherein $R^1$ to $R^4$ are each independently a monovalent hydrocarbon group of 1 to 8 carbon atoms, m is an integer of 1 to 100, B is a positive number, A is 0 or a positive number, A+B=1, and Y is a divalent organic group having the general formula (4):

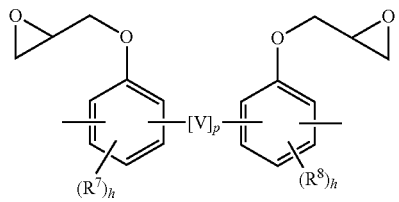

(4)

wherein V is a divalent organic group selected from the following:

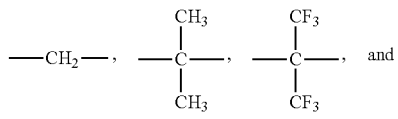

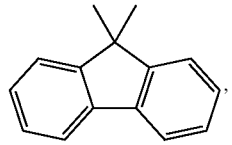

p is 0 or 1, $R^7$ and $R^8$ are each independently an alkyl or alkoxy group of 1 to 4 carbon atoms, and h is 0, 1 or 2.

7. A method for manufacturing a thin wafer from a wafer having a circuit-forming front surface and a non-circuit-forming back surface, comprising the steps of:
(a) forming a first temporary bond layer of a non-silicone thermoplastic resin (A) on the circuit-forming front surface of the wafer, forming a thermosetting silicone composition layer (B') thereon, forming a siloxane-containing composition layer (C') on one surface of a support, and joining the thermosetting silicone composition layer (B') on the wafer to the siloxane-containing composition layer (C') on the support in vacuum,
(b) heat curing the thermosetting silicone composition layer (B') and the siloxane-containing composition layer (C') for thereby bonding a second temporary bond layer in the form of a thermosetting siloxane polymer layer (B) which is the cured product of the thermosetting silicone composition layer (B') to a third temporary bond layer in the form of a thermosetting siloxane-modified polymer layer (C) which is the cured product of the siloxane-containing composition layer (C'), thus yielding a composite temporary adhesive layer of trilayer structure consisting of the first, second and third temporary bond layers via which the wafer is bonded to the support,
(c) grinding or polishing the non-circuit-forming back surface of the wafer bonded to the support via the composite temporary adhesive layer, (d) processing the non-circuit-forming back surface of the wafer, (e) releasing the processed wafer from the composite temporary adhesive layer and the support, and (f) cleaning the surface of the processed wafer which has been released from the composite temporary adhesive layer.

8. The method of claim 7 wherein step (e) includes immersing the overall wafer in a solvent and thereafter releasing the support from the wafer.

9. The method of claim 7 wherein step (f) includes cleaning with two fluids.

10. The method of claim 7 wherein the step of joining the thermosetting silicone composition layer (B') to the siloxane-containing composition layer (C') in vacuum includes heating at a temperature of 40 to 200° C.

11. The method of claim 7 wherein the thermosetting silicone composition layer (B') is a layer of a composition comprising (B-1) an organopolysiloxane having at least two alkenyl groups per molecule, (B-2) an organohydrogenpolysiloxane containing at least two silicon-bonded hydrogen atoms (Si—H groups) per molecule, in such an amount that a molar ratio of Si—H groups in component (B-2) to alkenyl groups in component (B-1) may range from 0.3/1 to 10/1, and (B-3) a platinum-based catalyst.

12. The method of claim 7 wherein the siloxane-containing composition layer (C') is a layer of a composition comprising 100 parts by weight of a siloxane bond-containing polymer comprising recurring units of the general formula (1) and having a weight average molecular weight of 3,000 to 500,000, and 0.1 to 50 parts by weight of a crosslinker which is selected from the group consisting of an amino condensate, melamine resin or urea resin modified with formaldehyde or formaldehyde-alcohol, a phenol compound having on average at least two methylol or alkoxymethylol groups per molecule, and an epoxy compound having on average at least two epoxy groups per molecule,

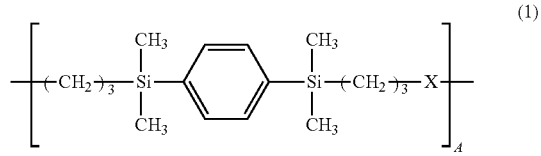
(1)

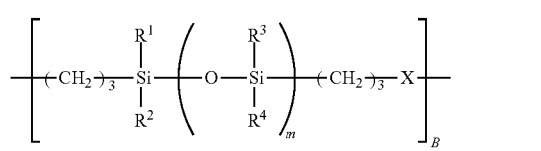

wherein R¹ to R⁴ are each independently a monovalent hydrocarbon group of 1 to 8 carbon atoms, m is an integer of 1 to 100, B is a positive number, A is 0 or a positive number, A+B=1, and X is a divalent organic group having the general formula (2):

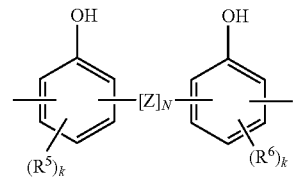
(2)

wherein Z is a divalent organic group selected from the following:

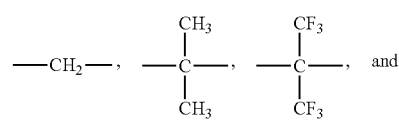

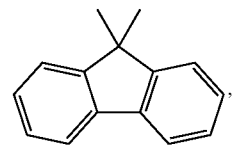

N is 0 or 1, R⁵ and R⁶ are each independently an alkyl or alkoxy group of 1 to 4 carbon atoms, and k is 0, 1 or 2.

13. The method of claim 7 wherein the siloxane-containing composition layer (C') is a layer of a composition comprising 100 parts by weight of a siloxane bond-containing polymer comprising recurring units of the general formula (3) and having a weight average molecular weight of 3,000 to 500,000, and 0.1 to 50 parts by weight of a crosslinker which is selected from the group consisting of a phenol compound having on average at least two phenolic hydroxyl groups per molecule and an epoxy compound having on average at least two epoxy groups per molecule,

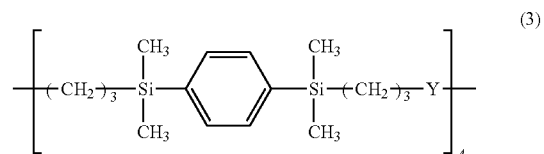
(3)

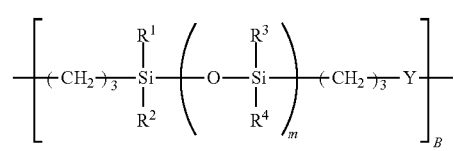

wherein R¹ to R⁴ are each independently a monovalent hydrocarbon group of 1 to 8 carbon atoms, m is an integer of 1 to 100, B is a positive number, A is 0 or a positive number, A+B=1, and Y is a divalent organic group having the general formula (4):

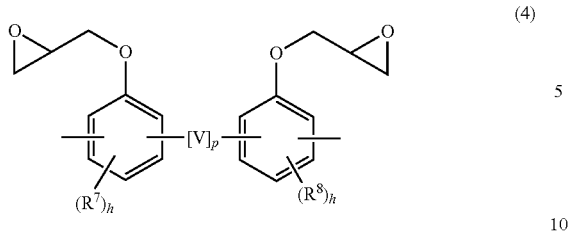
(4)
wherein V is a divalent organic group selected from the following:
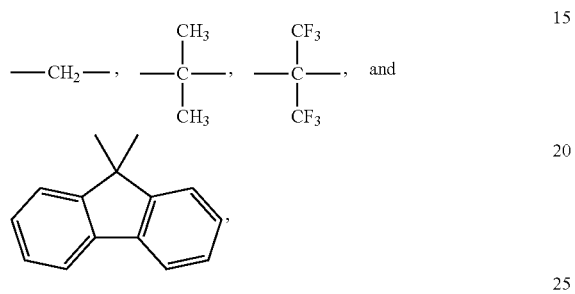
p is 0 or 1, $R^7$ and $R^8$ are each independently an alkyl or alkoxy group of 1 to 4 carbon atoms, and h is 0, 1 or 2.
* * * * *